(12) United States Patent
Ikeda et al.

(10) Patent No.: US 9,390,641 B2
(45) Date of Patent: Jul. 12, 2016

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Takayuki Ikeda, Kanagawa (JP); Takashi Nakagawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 238 days.

(21) Appl. No.: 13/686,223

(22) Filed: Nov. 27, 2012

(65) Prior Publication Data

US 2013/0135277 A1    May 30, 2013

(30) Foreign Application Priority Data

Nov. 29, 2011    (JP) ................................. 2011-260573

(51) Int. Cl.
 *G09G 3/32* (2006.01)
 *G09G 1/00* (2006.01)
 *H01L 27/12* (2006.01)

(52) U.S. Cl.
 CPC .............. *G09G 1/005* (2013.01); *G09G 3/3233* (2013.01); *H01L 27/1255* (2013.01); *G09G 2300/0861* (2013.01)

(58) Field of Classification Search
 CPC .......................................... G09G 3/30–3/3291
 USPC ....................................................... 345/76–81
 See application file for complete search history.

(56) References Cited

U.S. PATENT DOCUMENTS

| | | | |
|---|---|---|---|
| 6,774,877 B2 * | 8/2004 | Nishitoba et al. ............... | 345/76 |
| 7,402,465 B2 | 7/2008 | Noguchi et al. | |
| 7,416,924 B2 | 8/2008 | Noguchi et al. | |
| 7,683,860 B2 | 3/2010 | Nagao et al. | |
| 7,816,678 B2 | 10/2010 | Noguchi et al. | |
| 8,026,877 B2 | 9/2011 | Osame et al. | |
| 2002/0024493 A1 * | 2/2002 | Ozawa et al. ................... | 345/92 |
| 2004/0239599 A1 * | 12/2004 | Koyama ......................... | 345/76 |
| 2008/0074412 A1 | 3/2008 | Nozawa | |
| 2008/0291136 A1 * | 11/2008 | Inoue et al. ..................... | 345/76 |
| 2012/0032199 A1 | 2/2012 | Osame et al. | |

FOREIGN PATENT DOCUMENTS

JP    2006-301629 A    11/2006

* cited by examiner

*Primary Examiner* — Alexander Eisen
*Assistant Examiner* — Cory Almeida
(74) *Attorney, Agent, or Firm* — Fish & Richardson P.C.

(57) ABSTRACT

To suppress enlargement of pixel area even in the case of reducing current supplied to an electroluminescent element. A switch transistor, a first driving transistor, an electroluminescent element, and a second driving transistor provided between the first driving transistor and the electroluminescent element are included. A power supply potential is supplied to a gate of the second driving transistor. Drain current of the second driving transistor is controlled by the first driving transistor and the second driving transistor, so that a value of current supplied to the electroluminescent element is controlled.

17 Claims, 8 Drawing Sheets

DISPLAY DEVICE AND ELECTRONIC DEVICE

BACKGROUND OF THE INVENTION

1. Field of the Invention

An embodiment of the present invention relates to a display device. An embodiment of the present invention relates to an electronic device.

2. Description of the Related Art

In recent years, technological development of display devices with higher definition has been advanced.

An example of the display device is an electroluminescent display device (also referred to as an EL display device), or the like (e.g., Patent Document 1). The EL display device has an electroluminescent element (also referred to as an EL element) and a driving transistor for controlling the amount of current supplied to the EL element.

In order that the EL display device may have higher definition, the number of pixels may be increased for higher resolution. In this case, the EL display device needs a reduction in luminance variation among pixels and higher operation speed of a driver circuit. Accordingly, field-effect transistors in the EL display device preferably have high field-effect mobility and small variations in electrical characteristics; for example, a field-effect transistor where a single crystal silicon layer is used for a channel formation region is preferably used.

On the other hand, when the number of pixels is increased while the size of a panel is fixed, the area per pixel is decreased. In addition, pixel area determines the amount of current needed for an EL element. Since the area of an EL element is decreased as a pixel area is decreased, the amount of current supplied to the EL element is required to be reduced. In order to decrease the amount of current supplied to an EL element, current flowing between a source and a drain of a driving transistor (also referred to as drain current) may be reduced, for example.

REFERENCE

[Patent Document 1] Japanese Published Patent Application No. 2006-301629

SUMMARY OF THE INVENTION

A conventional display device has a problem in that when the amount of current supplied to an EL element is decreased as definition becomes higher, pixel area is increased, which prevents the definition of the display device from being higher. The reason is shown below.

A conventional display device needs a driving transistor with longer channel length and smaller channel width in order to reduce the drain current of the driving transistor without an increase in manufacturing steps and degradation in characteristics (e.g., field-effect mobility, threshold voltage, and variations in electrical characteristics) of the other field-effect transistors. Since the channel width has a limit on processing accuracy and cannot be smaller than a certain value, the channel length of the driving transistor should be lengthened to decrease the drain current of the driving transistor. Lengthening the channel length of the driving transistor naturally leads to enlargement of pixel area. Therefore, it is difficult to lengthen the channel length of a driving transistor while the area per pixel becomes smaller for higher definition.

In view of the above problem, an object of one embodiment of the present invention is to prevent enlargement of pixel area even when the amount of current supplied to an EL element is reduced.

In one embodiment of the present invention, a pixel circuit of a display device includes a switch transistor, a first driving transistor, an EL element, and a second driving transistor provided between the first driving transistor and the EL element.

The potential of a data signal is applied to a gate of the first driving transistor through the switch transistor and a value of drain current is controlled in accordance with the potential of the data signal.

The second driving transistor and the first driving transistor are formed in the same manufacturing step and have the same conductivity type. A power supply potential is applied to a gate of the second driving transistor. The power supply potential is preferably a constant potential.

The first driving transistor and the second driving transistor each have a function of controlling a value of current supplied to the EL element.

In one embodiment of the present invention, when the first driving transistor operates in a linear region, and the maximum value of the drain current of the second driving transistor in a saturation region is $Id_{max}$, the drain current of the second driving transistor is controlled by the first driving transistor and the second driving transistor so that $Id_{max}$ satisfies the following formula (1).

[FORMULA 1]

$$Id_{max} < \frac{1}{2} \frac{W}{L_1 + L_2} \mu Cox (V_g - V_{th})^2 \quad (1)$$

Note that in the formula (1), $L_1$ is a channel length of the first driving transistor, $L_2$ is a channel length of the second driving transistor, W is a channel width of the first driving transistor, $\mu$ is a field-effect mobility of the first driving transistor, $V_g$ is a voltage between a gate and a source of the first driving transistor, $V_{th}$ is a threshold voltage of the first driving transistor, and Cox is the sum of gate capacitances of the first driving transistor and the second driving transistor.

As described above, in one embodiment of the present invention, a value of drain current of the second driving transistor in a saturation region is controlled by the first and second driving transistors so as to satisfy the formula (1), whereby a value of current supplied to the EL element is decreased.

In another embodiment of the present invention, a panel provided for a housing of an electronic device is formed using a display device including the pixel circuit.

In one embodiment of the present invention, even when drain current of a second driving transistor and current supplied to an EL element are reduced by a first driving transistor and the second driving transistor, the sum of channel lengths of the first and second driving transistors can be smaller than or equal to the channel length of a conventional driving transistor. Thus, an increase in pixel area can be suppressed.

DETAILED DESCRIPTION OF THE INVENTION

An example of the embodiment of the present invention will be described below. Note that it will be readily appreciated by those skilled in the art that details of the embodiments can be modified in various ways without departing from the spirit and scope of the present invention. Thus, the present invention should not be limited to, for example, the description of the following embodiments.

Note that the contents in different embodiments can be combined with one another as appropriate. In addition, the contents of the embodiments can be replaced with each other as appropriate.

Further, the ordinal numbers such as "first" and "second" are used to avoid confusion between components and do not limit the number of each component.

Embodiment 1

In this embodiment, an example of a display device that is one embodiment of the present invention will be described with reference to FIG. 1, FIG. 2, FIGS. 3A and 3B, FIGS. 4A and 4B, FIGS. 5A and 5B, FIG. 6, and FIG. 7.

Figure 1:
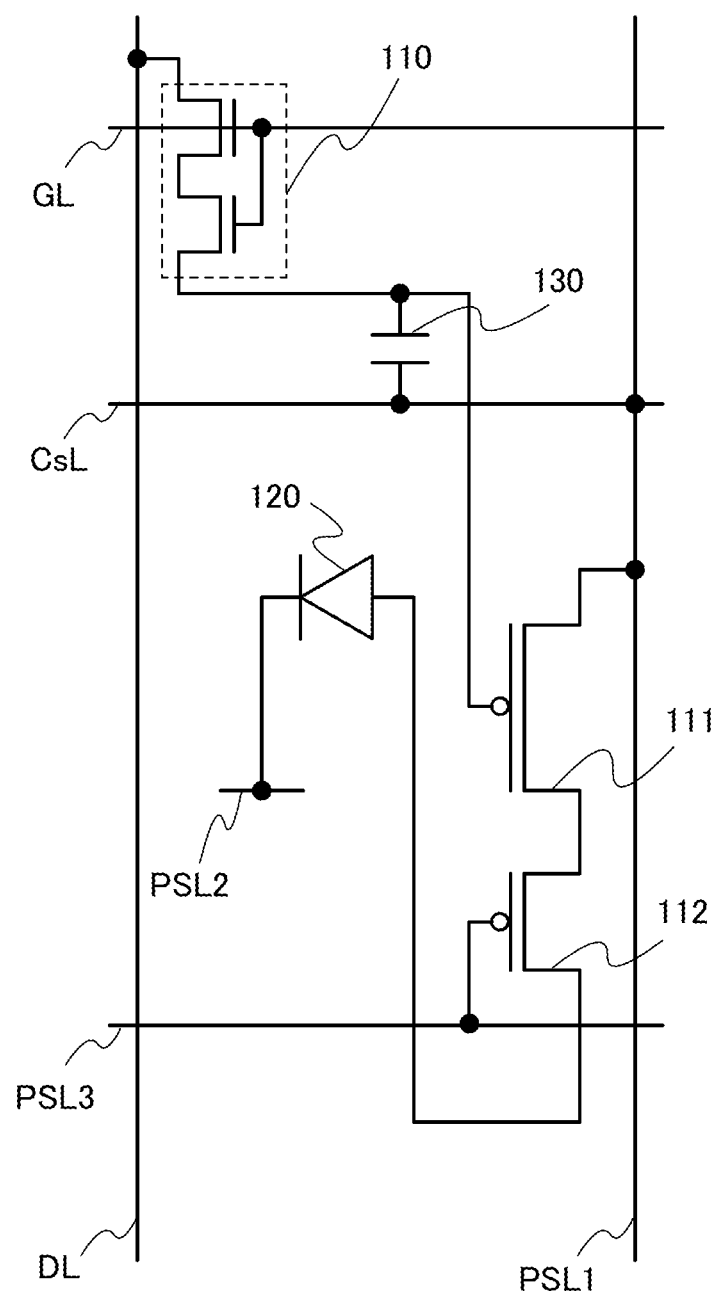
FIG. 1 is a circuit diagram illustrating a circuit configuration of a display device.

First, a circuit configuration of a pixel circuit of the display device of this embodiment will be described with reference to FIG. 1. FIG. 1 is a circuit diagram illustrating the circuit configuration of a pixel circuit.

As shown in FIG. 1, the display device of this embodiment has a switch transistor 110 that is a field-effect transistor, a first driving transistor 111 that is a field-effect transistor, a capacitor 130, an EL element (electroluminescent element) 120, and a second driving transistor 112 that is a field-effect transistor.

The potential of a data signal is applied to one of a source and a drain of the switch transistor 110 through a data signal line DL. The potential of a gate signal is applied to a gate of the switch transistor 110 through a gate signal line GL. When the switch transistor 110 has a double-gate structure, off-state current of the transistor can be reduced; however, the structure of the transistor is not limited thereto. The switch transistor 110 is an n-channel transistor in FIG. 1, but it is not limited thereto. The switch transistor 110 may be a p-channel transistor. The switch transistor 110 has a function of determining whether or not data of a data signal held by the pixel circuit is rewritten.

A first power supply potential VP1 is applied to one of a source and a drain of the first driving transistor 111 through a first power supply line PSL1. A gate of the first driving transistor 111 is connected to the other of the source and the drain of the switch transistor 110. The gate of the first driving transistor 111 is not necessarily directly connected to the other of the source and the drain of the switch transistor 110 as long as the potential of the gate of the first driving transistor 111 is controlled by a data signal. The first driving transistor 111 is not limited to be a p-channel transistor, and may be an n-channel transistor. The first driving transistor 111 has a function of controlling the amount of current supplied to the EL element 120.

A capacitor potential is applied to one of a pair of electrodes of the capacitor 130 through a capacitor line CsL. The other of the pair of electrodes of the capacitor 130 is connected to the gate of the first driving transistor 111. Note that the capacitor 130 can have a structure other than the following one: the capacitor 130 is a MOS capacitor, and the capacitor line CsL is connected to the first power supply line PSL1 to supply the first power supply potential VP1 as a capacitor potential. However, the structure is not limited thereto. For example, the potential different from the first power supply potential VP1 may be supplied as a capacitor potential without a connection between the capacitor line CsL and the first power supply line PSL1. Note that the capacitor 130 is not necessarily provided. The capacitor 130 functions as a storage capacitor that holds electric charges accumulated in the gate of the first driving transistor 111 at the time when data of a data signal is written to the pixel circuit.

A second power supply potential VP2 is applied to one of an anode and a cathode of the EL element 120 through a second power supply line PSL2. The EL element 120 may be a stacked EL element; however, the EL element is not limited thereto, and may be an inversely stacked EL element. The EL element 120 has a function of emitting light at a luminance that corresponds to drain current of the second driving transistor 112.

The second driving transistor 112 and the first driving transistor 111 are formed in the same manufacturing step and have the same conductivity type. One of a source and a drain of the second driving transistor 112 is connected to the other of the source and the drain of the first driving transistor 111. The other of the source and the drain of the second driving transistor 112 is connected to the other of the anode and the cathode of the EL element 120. A third power supply potential VP3 is applied to a gate of the second driving transistor 112 through a third power supply line PSL3. The third power supply potential VP3 is preferably a constant potential. Note that a potential within a predetermined amplitude range can be regarded as a constant potential. The second driving transistor 112 is not limited to a p-channel transistor and may be an n-channel transistor. The channel length of the first driving transistor 111 may be longer than the channel length of the second driving transistor 112; however the channel lengths are not limited thereto. The channel length of the first driving transistor 111 may be shorter than the channel length of the second driving transistor 112. The second driving transistor 112 has a function of controlling the amount of current supplied to the EL element 120.

Next, an example of a method for driving the display device shown in FIG. 1 is described. In this case, a first power supply potential and a second power supply potential are a high power supply potential and a low power supply potential, respectively.

First, the potential of the gate signal line GL is set by the potential of a gate signal to turn on the switch transistor 110. In addition, the potential of the data signal line DL is set by the potential of a data signal.

In this case, the potential of the gate of the first driving transistor 111 is substantially equal to the potential of a data signal. In this case, drain current of the first driving transistor 111 is $Id_{111}$.

The second driving transistor 112 operates in a saturation region in accordance with the drain current of the first driving transistor 111. In this case, drain current of the second driving transistor 112 is $Id_{112}$.

The drain current of the second driving transistor 112 in a saturation region ($Id_{112}$) is obtained by the following formula (2).

[FORMULA 2]

$$Id_{112} = \frac{1}{2} \frac{W_{112}}{L_{112}} \mu_{112} Cox_{112} (V_{g112} - V_{th112})^2 \quad (2)$$

In the formula (2), $L_{112}$ is the channel length of the second driving transistor 112, $W_{112}$ is a channel width of the second driving transistor 112, $\mu_{112}$ is a field-effect mobility of the second driving transistor 112, $V_{g112}$ is a voltage between the gate and the source of the second driving transistor 112, $V_{th112}$ is a threshold voltage of the second driving transistor 112, and $Cox_{112}$ is a gate capacitance of the second driving transistor 112.

The drain current of the second driving transistor 112 in a saturation region can be regarded as being equivalent to the drain current of the first driving transistor 111. That is, the luminance of the EL element 120 corresponds to the potential of a data signal.

Even when the EL element 120 deteriorates, a change in the value of current supplied to the EL element 120 can be prevented by driving the second driving transistor 112 in a saturation region.

Further, in the display device of this embodiment, when the first driving transistor 111 operates in a linear region and the maximum drain current of the second driving transistor 112 in a saturation region is $Id_{112max}$, the drain current of the second driving transistor 112 is controlled by the first and second driving transistors 111 and 112 so that $Id_{112max}$ satisfies the following formula (3).

[FORMULA 3]

$$Id_{112max} < \frac{1}{2} \frac{W_{111}}{L_{111} + L_{112}} \mu_{111} Cox_z (V_{g111} - V_{th111})^2 \quad (3)$$

In the formula (3), $L_{111}$ is the channel length of the first driving transistor 111, $L_{112}$ is the channel length of the second driving transistor 112, $W_{111}$ is a channel width of the first driving transistor 111, $\mu_{111}$ is a field-effect mobility of the first driving transistor 111, $V_{g111}$ is a voltage between the gate and the source of the first driving transistor 111, $V_{th111}$ is a threshold voltage of the first driving transistor 111, and $Cox_z$ is the sum of gate capacitances of the first and second driving transistors 111 and 112.

The right side of the formula (3) is equivalent to a formula for obtaining the drain current of a third driving transistor in a saturation region in the case where the first and second driving transistor 111 and 112 in FIG. 1 are correctively referred to as the third driving transistor, one of a source and a drain of the third driving transistor is connected to the first power supply line PSL1 and the other of the source and the drain of the third transistor is connected to the other of the anode and the cathode of the EL element 120, and the channel length of the third driving transistor is equal to the sum of the channel lengths of the first driving transistor 111 in FIG. 1 and the second driving transistor 112 in FIG. 1.

In the display device of this embodiment, the first and second driving transistors 111 and 112 are formed in the same manufacturing step and have the same conductivity type. Accordingly, when the first and second driving transistors 111 and 112 have the same field-effect mobility and threshold voltage, the drain current of the second driving transistor 112 can be controlled to satisfy the formula (3) by appropriately setting the channel length of the first driving transistor 111, the channel length of the second driving transistor 112, the amplitude of a data signal, the values of the first to third power supply potentials VP1 to VP3, and the like. For example, the drain current of the second driving transistor 112 is preferably controlled to satisfy the formula (3) by setting the value of the power supply potential VP3 in accordance with the values of the channel length of the first driving transistor 111, the channel length of the second driving transistor 112, the amplitude of the data signal, and the first and second power supply potentials VP1 and VP2. Note that the first driving transistor 111 may operate in a saturation region as long as the formula (3) is satisfied.

The EL element 120 emits light at luminance corresponding to the drain current of the second driving transistor 112. In this case, the pixel circuit is in a light-emitting state (display state). By turning off the switch transistor 110 after that, the potential of the gate of the first driving transistor 111 can be retained; accordingly, the light-emitting state can be maintained.

The channel lengths of the first and second driving transistors 111 and 112 in the case where the formula (3) is satisfied are described. For the description, the display device of this embodiment is compared to a display device that is a comparison example.

Figure 2:
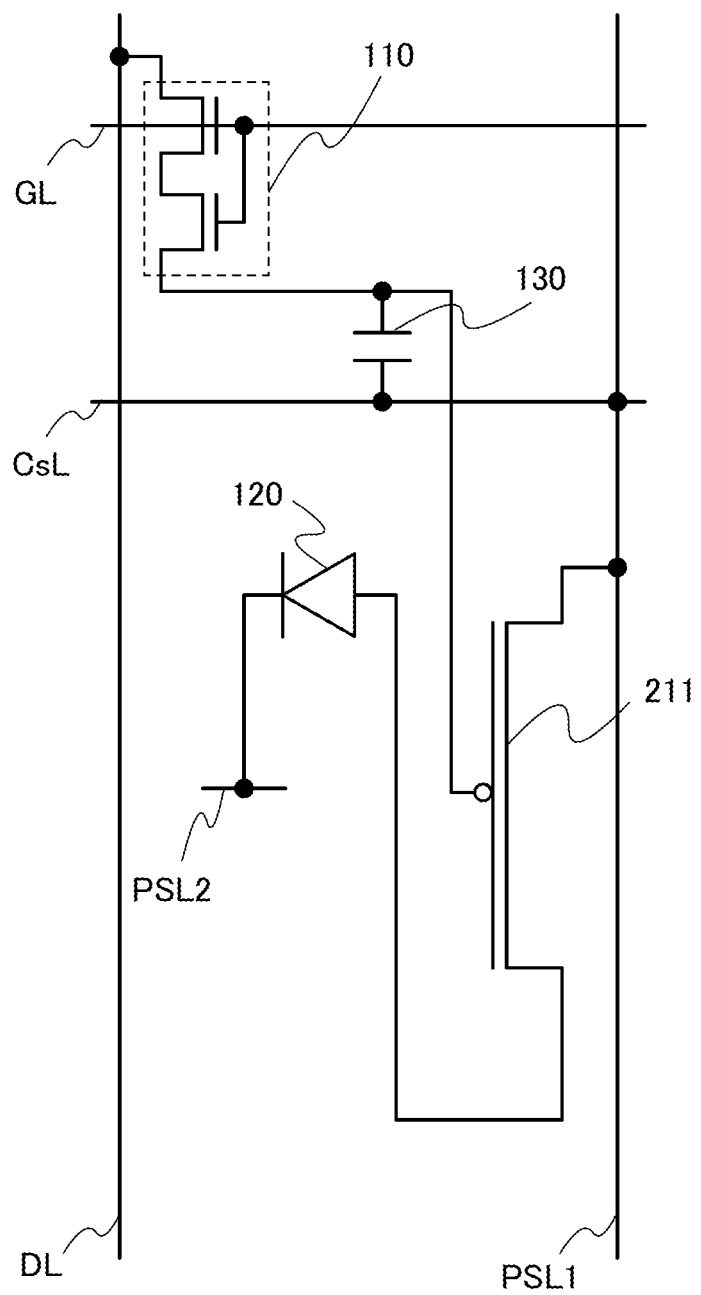
FIG. 2 is a circuit diagram illustrating a circuit configuration of a display device that is a comparison example.

First, a circuit configuration of a pixel circuit of the display device that is a comparison example is described with reference to FIG. 2. FIG. 2 illustrates the circuit configuration of the pixel circuit.

As illustrated in FIG. 2, the display device that is a comparison example has a driving transistor 211 instead of the first and second driving transistors 111 and 112 in FIG. 1. In this case, the first power supply potential VP1 is applied to one of a source and a drain of the driving transistor 211. The other of the source and the drain of the driving transistor 211 is connected to the other of the anode and the cathode of the EL element 120. A gate of the driving transistor 211 is connected to the other of the source and the drain of the switch transistor 110.

Next, a change in drain current of the second driving transistor 112 in FIG. 1 in the case of changing a voltage between the source and the drain (also referred to as drain voltage) and a change in drain current of the driving transistor 211 in FIG. 2 in the case of changing a drain voltage are described with reference to FIGS. 3A and 3B and FIGS. 4A and 4B. FIGS. 3A and 3B and FIGS. 4A and 4B show calculation results of a change in drain current of the second driving transistor 112 in FIG. 1 in the case of changing a drain voltage and a change in drain current of the driving transistor 211 in FIG. 2 in the case of changing a drain voltage. In FIGS. 3A and 3B and FIGS. 4A and 4B, the horizontal axis and the vertical axis represent drain voltage and drain current, respectively. Note that the calculation is performed with SmartSpice ver. 3.16.12.R developed by Silvaco Data Systems Inc and the calculation model is a LEVEL=36 RPI model. The driving transistor 211, the first driving transistor 111, and the second driving transistor 112 in a saturation region have the same values of $\mu$, $V_{th}$, and Cox in a formula to obtain current that are separately set on the basis of parameter conditions of calculation software. Each channel width of the driving transistor 211, the first driving transistor 111, and the second driving transistor 112 is 1 µm. In FIGS. 3A and 3B and FIGS. 4A and 4B, the drain voltage is in the range from −10 V to 2 V and the potential of the data signal is in the range from −0.6 V to 2 V. The drain currents of the driving transistor 211 and the second driving transistor 112 plotted in increments of 0.2 V are shown.

Figure 3A:
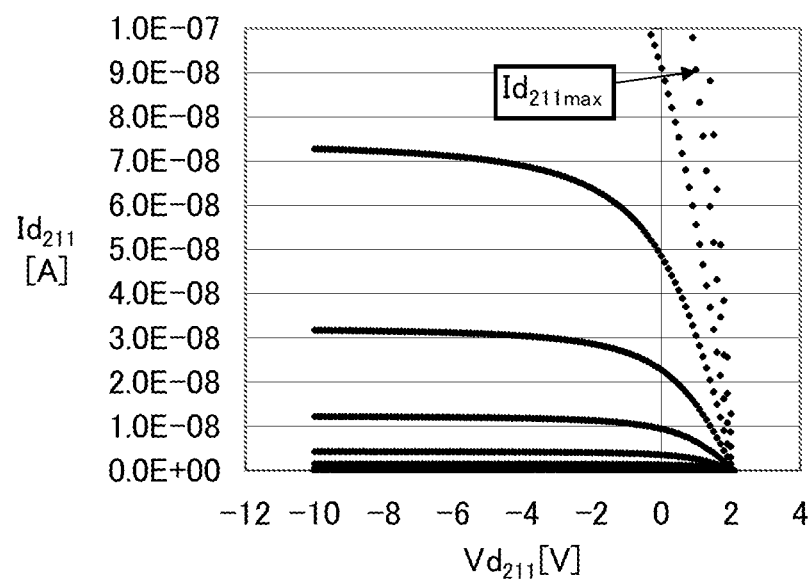
FIGS. 3A and 3B are graphs showing the calculation results of a change in drain current when voltage between a source and a drain of a transistor is changed.
Figure 3B:
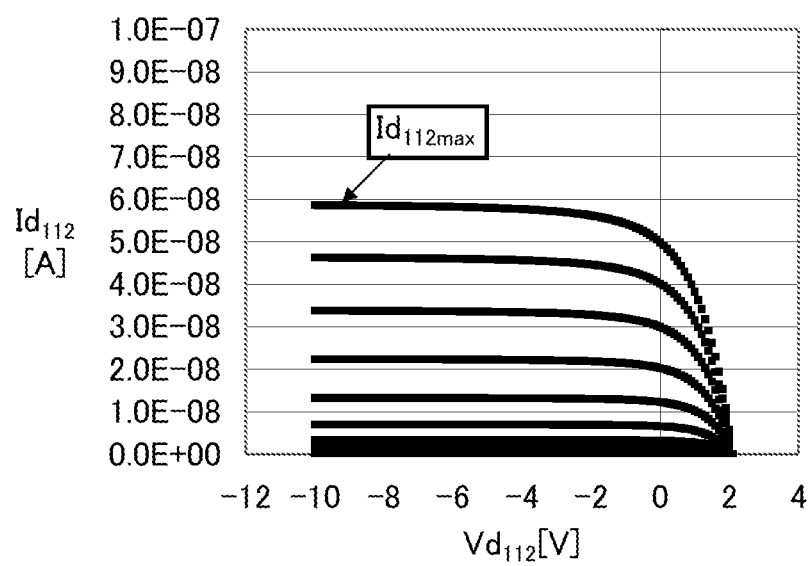

FIG. 3A shows the drain current of the driving transistor 211 in the case where the channel length of the driving transistor 211 is 46.9 µm. FIG. 3B shows the drain current of the second driving transistor 112 in the case where the channel lengths of the first driving transistor 111 and the second driving transistor 112 are 30.9 µm and 16 µm, respectively, and where the channel length of the driving transistor 211 is equal to the sum of the channel length of the first driving transistor 111 ($L_1$) and the channel length of the second driving transistor 112 ($L_2$). Other than the above, the driving transistor 211 has the same structure as the first driving transistor 111. In calculations described with reference to FIGS. 3A and 3B, a value of the first power supply potential VP1 and a value of the third power supply potential VP3 are 2.1 V and 0.6 V, respectively. A value of the second power supply potential VP2 is not changed in the calculations. In this case, for example, the top curve in FIG. 3B at a drain voltage of 0.1 V or lower indicates a saturation region.

As shown in FIGS. 3A and 3B, when the channel length of the driving transistor 211 is equal to the sum of the channel lengths of the first and second driving transistors 111 and 112, $Id_{112max}$, which is the maximum value of the drain current of the second driving transistor 112, is lower than $Id_{211max}$, which is the maximum value of the drain current of the driving transistor 211, in a saturation region. The reason is that the first driving transistor 111 operates in a linear region and the drain current of the first driving transistor 111 is lowered by the second driving transistor 112. Therefore, even when the drain current of the second driving transistor 112 is reduced, the channel length is prevented from being lengthened.

Figure 4A:
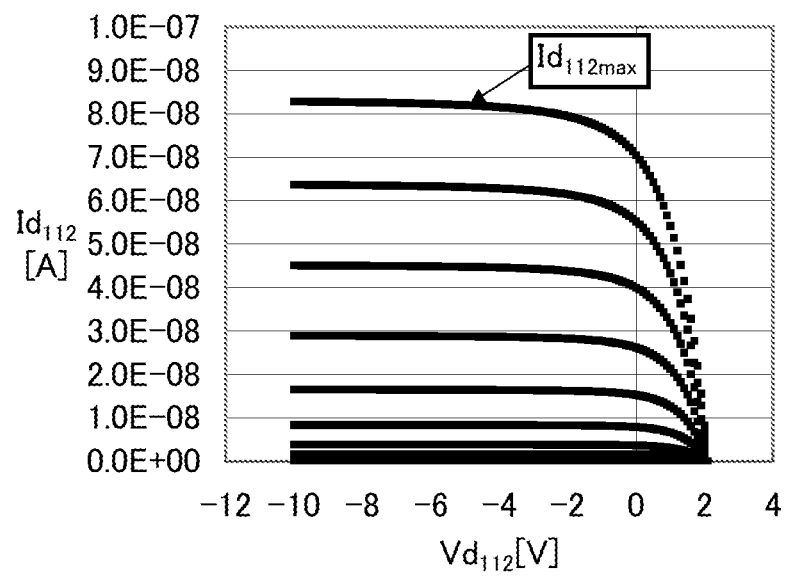
FIGS. 4A and 4B are graphs showing the calculation results of a change in drain current when voltage between a source and a drain of a transistor is changed.

FIG. 4A shows the drain current of the second driving transistor 112 in the case where only a value of the third power supply potential VP3 is changed, which differs from the calculation described with reference to FIG. 3B. In this case, the value of the third power supply potential VP3 is 0.4 V.

As shown in FIG. 4A, even when the third power supply potential is changed, $Id_{112max}$, which is the maximum value of the drain current of the second driving transistor 112, is lower than $Id_{211max}$, which is the maximum value of the drain current of the driving transistor 211.

Figure 4B:
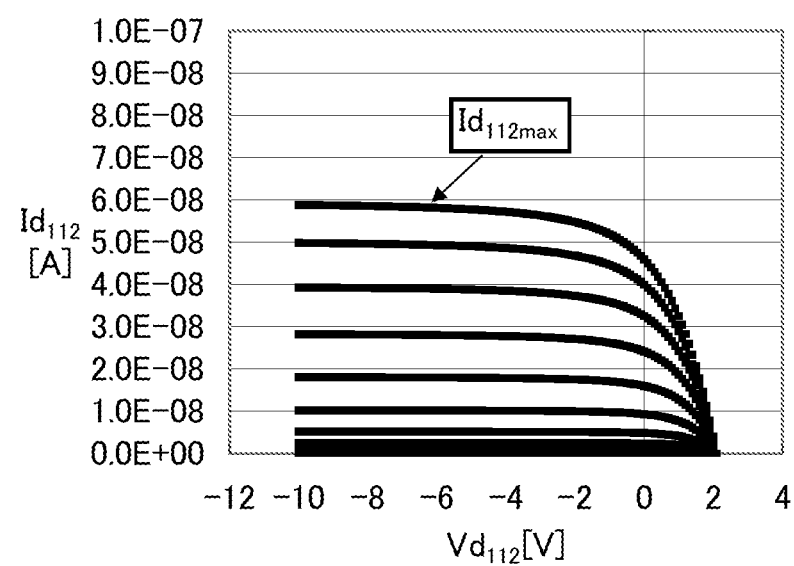

FIG. 4B shows the drain current of the second driving transistor 112 in the case where the channel length of the second driving transistor 112 is longer than the channel length of the first driving transistor 111, which differs from the calculation described with reference to FIG. 3B. In this case, the channel lengths of the first driving transistor 111 and the second driving transistor 112 are 16 µm and 30.9 µm, respectively. Accordingly, the channel length of the driving transistor 211 is equal to the sum of the channel lengths of the first and second driving transistors 111 and 112.

As shown in FIG. 4B, $Id_{112max}$, which is the maximum value of the drain current of the second driving transistor 112 in FIG. 1, is lower than $Id_{211max}$, which is the maximum value of the drain current of the driving transistor 211 in FIG. 2, even when the channel length of the second driving transistor 112 is longer than the channel length of the first driving transistor 111, and the channel length of the driving transistor 211 is equal to the sum of the channel lengths of the first and second driving transistors 111 and 112. Therefore, even when the drain current of the second driving transistor 112 is lowered, the channel length is prevented from being lengthened.

FIGS. 3A and 3B and FIGS. 4A and 4B prove that the channel length is prevented from being lengthened in the case where the maximum value of the drain current of the second driving transistor 112 in a saturation region satisfies the formula (3).

As described with reference to FIGS. 3A and 3B and FIGS. 4A and 4B, the drain current of the second driving transistor 112 is controlled by the first and second driving transistors 111 and 112 so that the maximum value of the drain current of the second driving transistor 112 in a saturation region satisfies the formula (3); as a result, the channel lengths of the first and second driving transistors 111 and 112 can be prevented from being lengthened even when the drain current of the second driving transistor 112 is reduced.

Next, a structural example of the display device in this embodiment will be described.

The display device of this embodiment includes a first substrate, a second substrate, and an electroluminescent element provided between the first and second substrates. The first substrate is provided with semiconductor elements such as the switch transistor 110, the first driving transistor 111, the capacitor 130, and the second driving transistor 112, and is also referred to as an active matrix substrate.

Figure 5A:
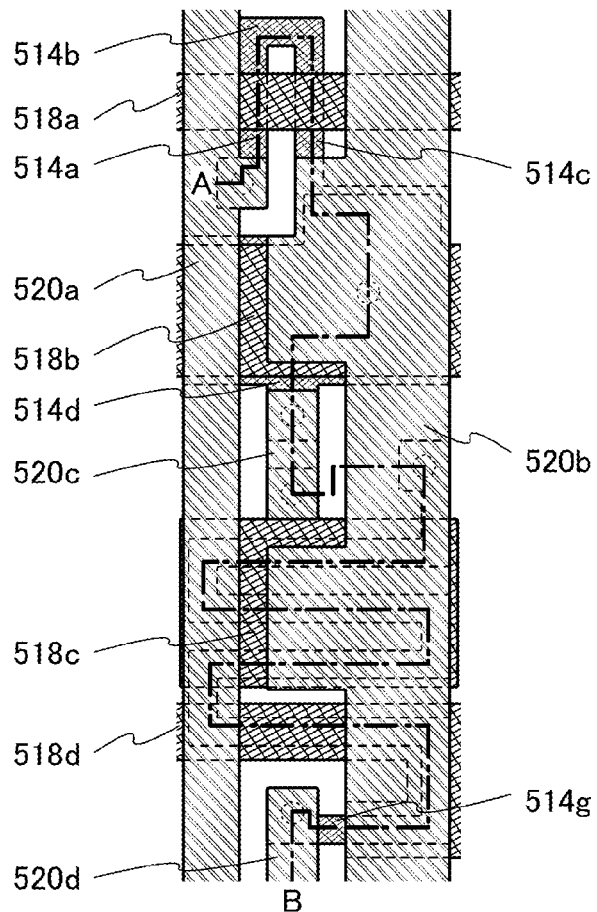
FIGS. 5A and 5B are a schematic plan view and a schematic cross sectional view of a structural example of an active matrix substrate.
Figure 5B:
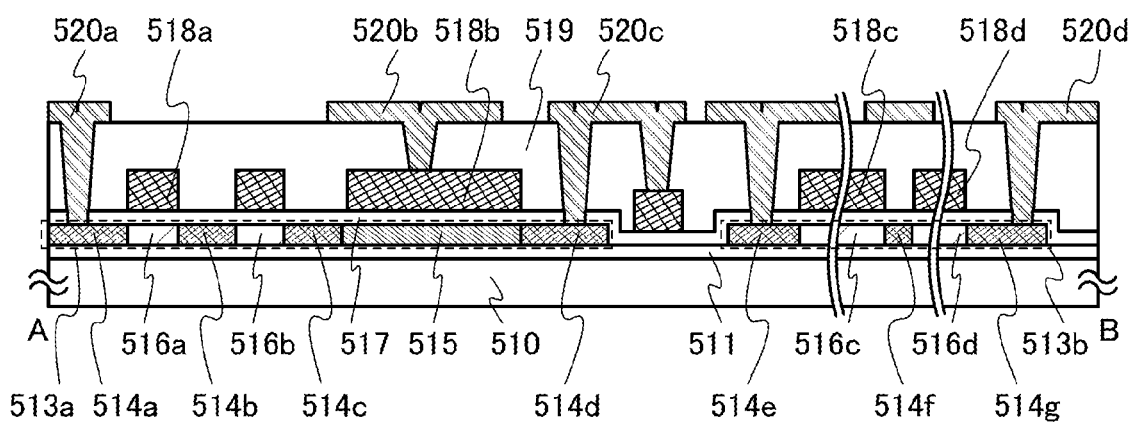

First, a structural example of an active matrix substrate of the display device of this embodiment is described with reference to FIGS. 5A and 5B. FIG. 5A is a schematic plan view of a structural example of the active matrix substrate, and FIG. 5B is a schematic cross sectional view thereof. FIG. 5B is a schematic cross sectional view taken along line A-B in FIG. 5A. Note that the components illustrated in FIGS. 5A and 5B include those having sizes different from the actual sizes. For convenience, FIG. 5B does not shows part of the active matrix substrate illustrated in FIG. 5A. A double wave line is a double break line.

The active matrix substrate illustrated in FIG. 5A includes a substrate 510, an insulating layer 511, semiconductor layers 513a and 513b, an insulating layer 517, conductive layers 518a to 518d, an insulating layer 519, and conductive layers 520a to 520d.

The insulating layer 511 is provided over one surface of the substrate 510.

The insulating layer 511 functions as a base layer, for example.

The semiconductor layers 513a and 513b are provided over part of the insulating layer 511.

The semiconductor layer 513a includes impurity regions 514a to 514d and an impurity region 515. A channel formation region 516a of the switch transistor 110 is provided between the impurity region 514a and the impurity region 514b. A channel formation region 516b of the switch transistor 110 is provided between the impurity region 514b and the impurity region 514c. The impurity region 515 is provided between the impurity region 514c and the impurity region 514d.

The semiconductor layer 513b includes impurity regions 514e to 514g. A channel formation region 516c of the first driving transistor 111 is provided between the impurity region 514e and the impurity region 514f. A channel formation region 516d of the second driving transistor 112 is provided between the impurity region 514f and the impurity region 514g. The channel length of the channel formation region 516c is longer than that of the channel formation region 516d.

The impurity regions 514a to 514g and the impurity region 515 are regions to which an impurity element imparting p-type conductivity is added. The impurity concentration of the impurity region 515 is higher than that of the impurity regions 514a to 514g. When a potential different from the first power supply potential VP1 is supplied as a capacitor potential without a connection between the capacitor line CsL and the first power supply line PSL1, doping of the semiconductor layer 513a with an impurity element can be omitted, and the capacitor 130 can be formed without the impurity region 515. The semiconductor layer 513a functions as a channel formation layer of the switch transistor 110 and one of the pair of electrodes of the capacitor 130. The semiconductor layer 513b functions as a channel formation layer of the first driving transistor 111 and a channel formation layer of the second driving transistor 112.

The insulating layer 517 is provided over the semiconductor layers 513a and 513b. The insulating layer 517 functions as a gate insulating layer of the switch transistor 110, a gate insulating layer of the first driving transistor 111, a gate insulating layer of the second driving transistor 112, and a dielectric layer of the capacitor 130.

The conductive layers 518a to 518d are provided over part of the insulating layer 517.

The conductive layer 518a overlaps the channel formation regions 516a and 516b with the insulating layer 517 laid therebetween. The conductive layer 518a functions as the gate of the switch transistor 110.

The conductive layer 518b overlaps the impurity region 515 with the insulating layer 517 laid therebetween. The conductive layer 518b functions as the other of the pair of electrodes of the capacitor 130.

The conductive layer 518c overlaps the channel formation region 516c with the insulating layer 517 laid therebetween. The conductive layer 518c functions as the gate of the first driving transistor 111.

The conductive layer 518d overlaps the channel formation region 516d with the insulating layer 517 laid therebetween. The conductive layer 518d functions as the gate of the second driving transistor 112.

The insulating layer 519 is provided over the insulating layer 517 with the conductive layers 518a to 518d laid therebetween. The insulating layer 519 functions as a planarization layer.

The conductive layers 520a to 520d are provided over part of the insulating layer 519.

The conductive layer 520a is in contact with the impurity region 514a through a first opening penetrating the insulating layers 517 and 519.

The conductive layer 520b is in contact with the conductive layer 518b through a second opening penetrating the insulating layer 519. The conductive layer 520b is in contact with the impurity region 514e through a third opening penetrating the insulating layers 517 and 519.

The conductive layer 520c is in contact with the impurity region 514d through a fourth opening penetrating the insulating layers 517 and 519. The conductive layer 520c is in contact with the conductive layer 518c through a fifth opening penetrating the insulating layer 519.

The conductive layer 520d is in contact with the impurity region 514g through a sixth opening penetrating the insulating layers 517 and 519.

Figure 6:
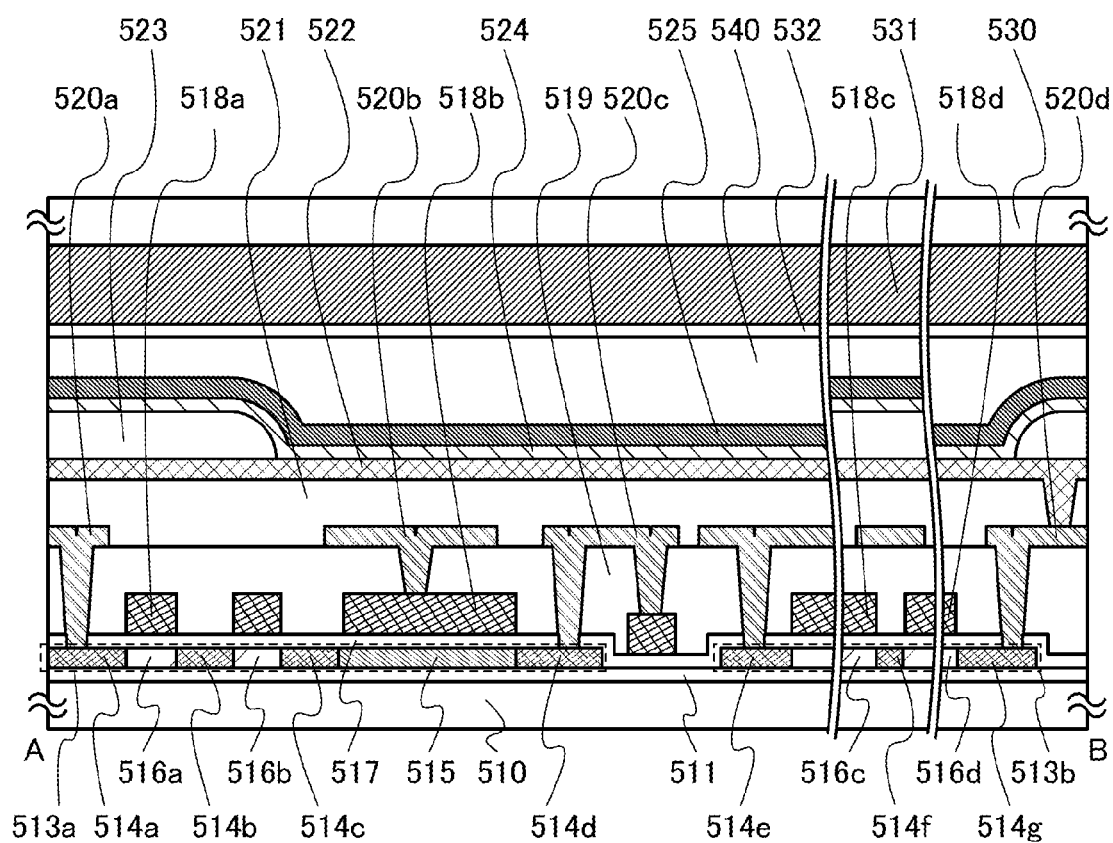
FIG. 6 is a schematic cross sectional view of a structural example of a display device.

Further, a structural example of the display device of this embodiment is described with reference to FIG. 6. FIG. 6 is a schematic cross sectional view showing a structural example of the display device of this embodiment. Note that the EL element 120 may emit light toward the top surface side of the display device; however, the EL element is not limited thereto, and may emit light toward the bottom surface side of the display device.

The display device illustrated in FIG. 6 includes an insulating layer 521, a conductive layer 522, an insulating layer 523, a light-emitting layer 524, a conductive layer 525, a substrate 530, a coloring layer 531, an insulating layer 532, and an insulating layer 540, in addition to the active matrix substrate illustrated in FIGS. 5A and 5B.

The insulating layer 521 is provided over the insulating layer 519 and the conductive layers 520a to 520d.

The conductive layer 522 is provided over the insulating layer 521. The conductive layer 522 is in contact with the conductive layer 520d through a seventh opening penetrating the insulating layer 521. The conductive layer 522 functions as the anode of the EL element 120. In the display device illustrated in FIG. 6, a capacitor can be formed using the conductive layer 522, the insulating layer 521, and the conductive layers 520a to 520d. In that case, a change in the first power supply potential VP1 can be suppressed, for example.

The insulating layer 523 is provided over the conductive layer 522.

The light-emitting layer 524 is in contact with the conductive layer 522 in an eighth opening provided for the insulating layer 523. The light-emitting layer 524 functions as a light-emitting layer of the EL element 120.

The conductive layer 525 is provided over a surface of the light-emitting layer 524. The conductive layer 525 functions as the cathode of the EL element 120.

The coloring layer 531 is provided on one plane of the substrate 530. The coloring layer 531 functions as a color filter that transmits light with a particular wavelength of light emitted from the light-emitting layer 524.

The insulating layer 532 is provided over the one plane of the substrate 530 with the coloring layer 531 laid therebetween.

The insulating layer 540 is provided between the insulating layer 532 and the conductive layer 525.

Next, components will be described below.

Examples of the substrate 510 and the substrate 530 are a glass substrate, a silicon substrate, and a plastic substrate.

The insulating layer 511 can be, for example, a layer including an oxide insulating material or a layer including a material such as silicon oxide, silicon oxynitride, or silicon nitride oxide. The insulating layer 511 can be a stack of layers formed using materials that can be used for the insulating layer 511.

The semiconductor layers 513a and 513b can be, for example, a single crystal semiconductor layer or a single crystal silicon layer.

An example of a method for fabricating the semiconductor layers 513a and 513b is described below.

For example, a first semiconductor substrate and a second semiconductor substrate whose top surface is provided with the insulating layer are prepared. Note that an impurity element imparting n-type or p-type conductivity may be added to the first semiconductor substrate in advance. An oxide insulating layer or a nitride insulating layer may be formed over the first semiconductor substrate in advance.

For example, the insulating layer can be formed over the second semiconductor substrate by formation of an oxide insulating film by thermal oxidation, CVD, sputtering, or the like.

In addition, an ion beam including ions which are accelerated by an electric field enters the second semiconductor substrate, and a fragile region is formed in a region at a certain depth from a surface of the second semiconductor substrate.

Note that the depth at which the fragile region is formed is adjusted by the kinetic energy, mass, electrical charge, or incidence angle of the ions, or the like.

For example, ions can be introduced into the semiconductor substrate with the use of an ion doping apparatus or an ion implantation apparatus.

As ions used for irradiation, for example, hydrogen and/or helium can be used. For example, in the case where irradiation is performed with hydrogen ions using an ion doping apparatus, the efficiency of irradiation of ions can be improved by increasing the proportion of $H_3^+$ in the ions used for irradiation. Specifically, it is preferable that the proportion of $H_3^+$ is higher than or equal to 50% (more preferably, higher than or equal to 80%) with respect to the total amount of $H^+$, $H_2^+$, and $H_3^+$.

Further, the first semiconductor substrate and the second semiconductor substrate are attached to each other with the insulating layer which is provided on the second semiconductor substrate laid therebetween. Note that in the case where the first semiconductor substrate is also provided with an insulating layer, the first semiconductor substrate and the second semiconductor substrate are attached to each other with the insulating layer on the second semiconductor substrate and the insulating layer on the first semiconductor substrate laid therebetween. In that case, the insulating layers provided between the first semiconductor substrate and the second semiconductor substrate correspond to the insulating layer 511.

Furthermore, heat treatment is performed so that the second semiconductor substrate is separated with the fragile region used as a cleavage plane. Thus, the semiconductor layer can be formed over the insulating layer 511. Note that when a surface of the semiconductor layer is irradiated with laser light, the flatness of the surface of the semiconductor layer can be improved. Further, part of the semiconductor layer is etched, and accordingly, the semiconductor layers 513a and 513b can be formed.

However, this embodiment is not limited thereto, and for example, a Smart Cut (registered trademark) method or a SIMOX method can be used to form the semiconductor layers 513a and 513b. Alternatively, the semiconductor layers 513a and 513b can be semiconductor regions formed by provision of an insulating separation region in a single crystal semiconductor substrate.

The impurity regions 514a to 514g and the impurity region 515 are formed by, for example, addition of an impurity element imparting a conductivity type to the semiconductor layers 513a and 513b. For example, an impurity element imparting n-type conductivity (e.g., phosphorus) is added in the case of an n-channel transistor, and an impurity element imparting p-type conductivity (e.g., boron) is added in the case of a p-channel transistor.

The insulating layer 517 can be, for example, a layer including a material such as silicon oxide, silicon nitride, silicon oxynitride, silicon nitride oxide, aluminum oxide, aluminum nitride, aluminum oxynitride, aluminum nitride oxide, or hafnium oxide. The insulating layer 517 can be a stack of layers formed using materials that can be used for the insulating layer 517.

Each of the conductive layers 518a to 518d can be a layer containing a metal material such as molybdenum, titanium, chromium, tantalum, magnesium, silver, tungsten, aluminum, copper, neodymium, or scandium. Alternatively, each of the conductive layers 518a to 518d can be a layer containing a conductive metal oxide. The conductive metal oxide can be, for example, a metal oxide such as indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO); or the metal oxide containing silicon, silicon oxide, or nitrogen. Alternatively, the conductive layers 518a to 518d can be a stack of layers formed using materials that can be used for the conductive layers 518a to 518d.

The insulating layer 519 can be, for example, a layer containing a material such as silicon oxide, silicon nitride, silicon oxynitride, silicon nitride oxide, aluminum oxide, aluminum nitride, aluminum oxynitride, aluminum nitride oxide, or hafnium oxide. The insulating layer 519 can be a stack of layers formed using materials that can be used for the insulating layer 519.

Each of the conductive layers 520a to 520d can be a layer containing a metal material such as molybdenum, titanium, chromium, tantalum, magnesium, silver, tungsten, aluminum, copper, neodymium, ruthenium, or scandium. Alternatively, each of the conductive layers 520a to 520d can be a layer containing a conductive metal oxide. The conductive metal oxide can be, for example, a metal oxide such as indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO); or the metal oxide containing silicon, silicon oxide, or nitrogen. Alternatively, the conductive layers 520a to 520d can be a stack of layers formed using materials that can be used for the conductive layers 520a to 520d.

The insulating layer 521 can be an organic insulating layer or an inorganic insulating layer, for example.

The conductive layer 522 can be a layer containing a metal material such as molybdenum, titanium, chromium, tantalum, magnesium, silver, tungsten, aluminum, copper, neodymium, ruthenium, or scandium. Alternatively, the conductive layer 522 can be a stack of layers formed using materials that can be used for the conductive layer 522.

The insulating layer 523 can be an organic insulating layer or an inorganic insulating layer, for example.

The light-emitting layer 524 can be, for example, a light-emitting layer using a light-emitting material which emits light of a specific color. The light-emitting layer 524 can also be formed using a stack of light-emitting layers which emit light of different colors. The light-emitting material can be an electroluminescent material such as a fluorescent material or a phosphorescent material. Alternatively, the light-emitting material can be formed by a material containing a plurality of electroluminescent materials. For example, a light-emitting layer emitting white light may be formed by a stack of a layer of a fluorescent material emitting blue light, a layer of a first phosphorescent material emitting orange color, and a layer of a second phosphorescent material emitting orange color. Alternatively, the electroluminescent material can be an organic electroluminescent material or an inorganic electroluminescent material. Further, in addition to the light-emitting layer, the electroluminescent layer may include one or more of a hole injection layer, a hole transport layer, an electron injection layer, and an electron transport layer.

The conductive layer 525 can be, for example, a light-transmitting layer that contains a metal oxide. The metal oxide can be, for example, a metal oxide such as indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO); or the metal oxide containing silicon, silicon oxide, or nitrogen. Alternatively, the conductive layer 525 can be a stack of layers formed using materials that can be used for the conductive layer 525.

The coloring layer 531 can be, for example, a layer which contains dye or pigment and which transmits light with the wavelength range of red, light with the wavelength range of green, or light with the wavelength range of blue. Alternatively, the coloring layer 531 can be formed using a layer which transmits cyan light, magenta light, or yellow light and which contains dye or pigment. When containing dye, the coloring layer 531 is formed by a photolithography method, a printing method, or an inkjet method, for example. When containing pigment, the coloring layer 531 is formed by a photolithography method, a printing method, an electrodeposition method, an electrophotographic method, or the like. By using the inkjet method, for example, the coloring layer can be manufactured at room temperature, manufactured at a low vacuum, or formed over a large substrate. Since the coloring layer can be manufactured without a resist mask, manufacturing cost and the number of steps can be reduced.

The insulating layer 532 can be a layer of a material which can be used for the insulating layer 517, for example. Alternatively, the insulating layer 532 can be a stack of layers formed using materials which can be used for the insulating layer 532. Note that the insulating layer 532 is not necessarily provided, but providing the insulating layer 532 can suppress the entry of an impurity from the coloring layer 531 to the EL element 120.

The insulating layer 540 can be a layer of a resin material, for example. Alternatively, the insulating layer 540 can be a stack of layers formed using materials that can be used for the insulating layer 540.

As shown in FIGS. 5A, 5B, and 6, the display device of this embodiment includes the EL element 120 that emits monochromatic light with a predetermined color as the EL element 120 and the coloring layer that transmits light with a particular wavelength of light emitted from the EL element 120. With this structure, a full-color image can be displayed without the plurality of EL elements 120 emitting light of different colors, which facilitates the manufacturing process and enhances yield. For example, the EL elements 120 can be formed without a metal mask, and therefore, a manufacturing process can be simple. Further, contrast of an image can be improved. Further, the quality and reliability of the EL elements 120 can be improved.

In the display device in this embodiment, the EL element 120 has a structure in which light is extracted through a substrate provided with no element such as a transistor, so that a region above a region provided with the element can be used as a light-emitting region; therefore, an aperture ratio can be improved.

Figure 7:
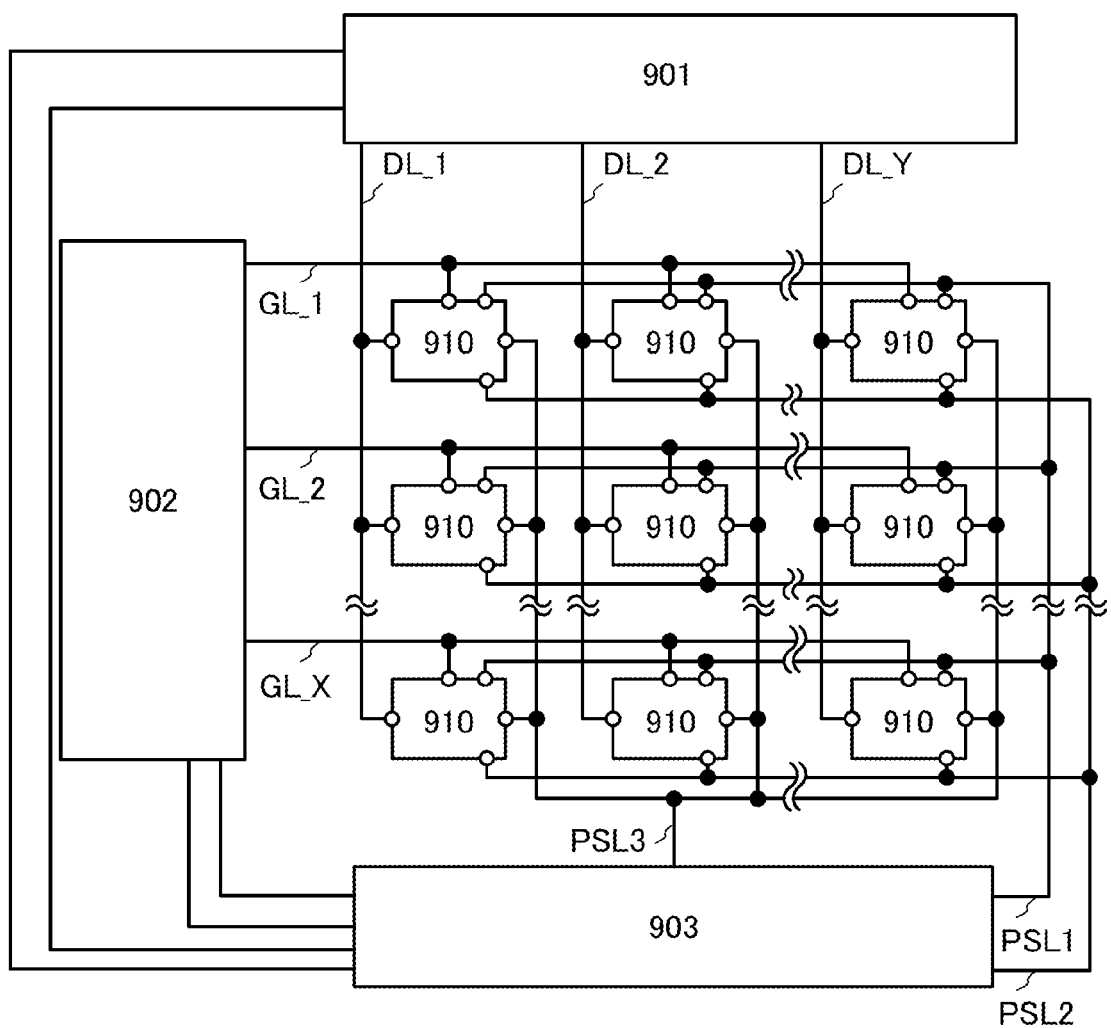
FIG. 7 is a block diagram illustrating a structural example of a display device.

The structural example of the display device of this embodiment is described using FIG. 7. FIG. 7 is a block diagram illustrating the structural example of the display device of this embodiment.

A display device illustrated in FIG. 7 has a plurality of pixel circuits 910 arranged in X rows and Y columns (X and Y are natural numbers greater than or equal to 2), first to Y-th data signal lines DL_1 to DL_Y, first to X-th gate signal lines GL_1 to GL_X, a first power supply line PSL1, a second power supply line PSL2, and a third power supply line PSL3.

Each of the plurality of pixel circuits 910 employs the circuit configuration illustrated in FIG. 1 here, as an example. For example, one pixel is composed of three pixel circuits 910 for displaying red (R), green (G), and blue (B). The horizontal resolution of the display device of this embodiment is preferably 800 ppi or more, preferably 800 ppi or more and 1000 ppi or less, for example.

In this case, in each of the plurality of pixel circuits 910, one of the source and the drain of the switch transistor 110 is connected to one of the first to Y-th data signal lines DL_1 to DL_Y. The gate of the switch transistor 110 is connected to one of the first to X-th gate signal lines GL_1 to GL_X.

One of the source and the drain of the first driving transistor 111 is connected to the first power supply line PSL1.

The other of the pair of electrodes of the capacitor 130 is connected to the first power supply line PSL1 through the capacitor line CsL.

One of the anode and the cathode of the EL element 120 is connected to the second power supply line PSL2.

The gate of the second driving transistor 112 is connected to the third power supply line PSL3.

The potentials of the first to Y-th data signal lines DL_1 to DL_Y are controlled by a driver circuit 901. The driver circuit 901 can be formed using an analog switch, a latch circuit, and an operation amplifier, for example.

The potentials of the first to X-th gate signal lines GL_1 to GL_X are controlled by a driver circuit 902. Note that the driver circuit 902 and the pixel circuit 910 may be formed over one substrate in the same manufacturing step. The driver circuit 902 can be formed using a shift register, for example.

The first power supply potential VP1 applied to the first power supply line PSL1, the second power supply potential VP2 applied to the second power supply line PSL2, and the third power supply potential VP3 applied to the third power supply line PSL3 can be generated in a power supply circuit 903. A power supply voltage is supplied to the driver circuits 901 and 902 with the power supply circuit 903. Note that the power supply circuit 903 may be formed over a substrate different from that of the pixel circuit 910 and connected by a wiring or the like.

An electrical connection of each of the plurality of pixel circuits 910 to the third power supply line PSL3 removes the necessity of an additional driver circuit and the like; accordingly, the circuit configuration can be simple.

As described with reference to FIG. 7, each of the plurality of pixel circuits 910 is electrically connected to the third power supply line to supply the common third power supply potential in the display device of this embodiment. With this configuration, the value of current supplied to the EL element 120 can be controlled by the second driving transistor 112 in each pixel circuit 910 without an additional driver circuit and the like.

Embodiment 2

In this embodiment, examples of an electronic device in which a housing is provided with a panel formed using the display device described in Embodiment 1 will be described with reference to FIGS. 8A to 8D.

Figure 8A:
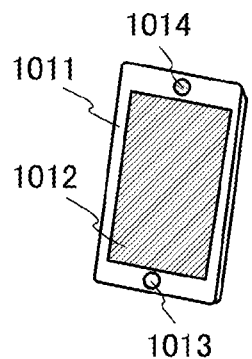
FIGS. 8A to 8D each illustrate an electronic device.

An electronic device illustrated in FIG. 8A is an example of a personal digital assistant.

The electronic device illustrated in FIG. 8A has a housing 1011 and a panel 1012, a button 1013, and a speaker 1014 that are provided for the housing 1011.

Note that the housing 1011 may be provided with a connection terminal for connecting the electronic device illustrated in FIG. 8A to an external device and/or a button used to operate the electronic device illustrated in FIG. 8A.

The panel 1012 functions as a display panel and a touch panel. The panel 1012 can be a panel formed by superposing a touch panel on the display device described in Embodiment 1.

The button 1013 is provided for the housing 1011. For example, when a power button functions as the button 1013, the electronic device can be turned on or off by pressing the button 1013.

The speaker 1014 is provided for the housing 1011. The speaker 1014 has a function of outputting sound.

Note that the housing 1011 may be provided with a microphone, in which case the electronic device illustrated in FIG. 8A can function as a telephone.

The electronic device illustrated in FIG. 8A functions as one or more of a telephone set, an e-book reader, a personal computer, and a game machine, for example.

Figure 8B:
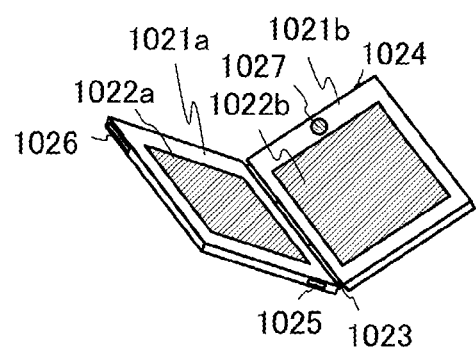

An electronic device illustrated in FIG. 8B is an example of a folding digital assistant.

The electronic device illustrated in FIG. 8B has a housing 1021a, a housing 1021b, a panel 1022a provided for the housing 1021a, a panel 1022b provided for the housing 1021b, a hinge 1023, a button 1024, a connection terminal 1025, a storage media inserting portion 1026, and a speaker 1027.

The housing 1021a and the housing 1021b are connected by the hinge 1023.

The panels 1022a and 1022b each function as a display panel and a touch panel. Each of the panels 1022a and 1022b can be a panel formed by superposing a touch panel on the display device described in Embodiment 1.

Since the electronic device illustrated in FIG. 8B has the hinge 1023, the housing 1021a or the housing 1021b can be moved to overlap the housing 1021a with the housing 1021b, for example; that is, the electronic device can fold.

The button 1024 is provided for the housing 1021b. Note that the housing 1021a may be provided with the button 1024. For example, when the button 1024 which functions as a power button is provided and pushed, whether power is supplied to circuits in the electronic device can be controlled.

The connection terminal 1025 is provided for the housing 1021a. Note that the housing 1021b may be provided with the connection terminal 1025. Alternatively, a plurality of connection terminals 1025 may be provided for one or both of the housings 1021a and the housing 1021b. The connection terminal 1025 is a terminal for connecting the electronic device illustrated in FIG. 8B to another device.

The storage media inserting portion 1026 is provided for the housing 1021a. Note that the storage medium insertion portion 1026 may be provided for the housing 1021b. Alternatively, the plurality of recording medium insertion portions 1026 may be provided for one or both of the housings 1021a and 1021b. For example, a card-type recording medium is inserted into the storage media inserting portion 1026 so that data can be read to the electronic device from the card-type recording medium or data stored in the electronic device can be written to the card-type recording medium.

The speaker 1027 is provided for the housing 1021b. The speaker 1027 has a function of outputting sound. Note that the speaker 1027 may be provided for the housing 1021a instead of the housing 1021b.

Note that the housing 1021a or 1021b may be provided with a microphone, in which case the electronic device illustrated in FIG. 8B can function as a telephone.

The electronic device illustrated in FIG. 8B functions as one or more of a telephone set, an e-book reader, a personal computer, and a game machine, for example.

Figure 8C:
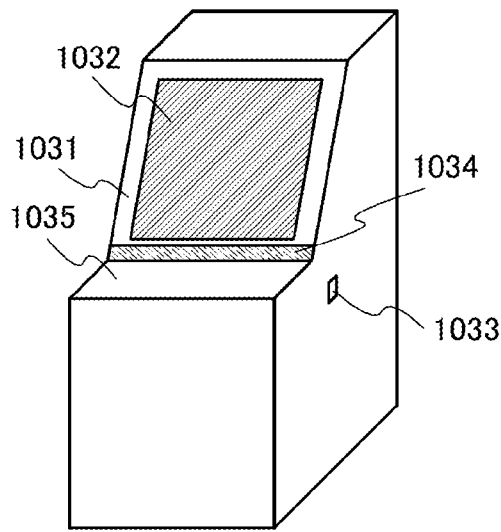

An electronic device illustrated in FIG. 8C is an example of a stationary information terminal. The stationary information terminal illustrated in FIG. 8C has a housing 1031, and a panel 1032, a button 1033, and a speaker 1034 that are provided for the housing 1031.

The panel 1032 functions as a display panel and a touch panel. The panel 1032 can be a panel formed by superposing a touch panel on the display device described in Embodiment 1.

Note that the panel 1032 can be provided for a deck portion 1035 of the housing 1031.

The housing 1031 may be provided with one or more of a ticket slot from which a ticket or the like is dispensed, a coin slot, and a bill slot.

The button 1033 is provided for the housing 1031. For example, when the button 1033 which functions as a power button is provided and pushed, whether power is supplied to circuits in the electronic device can be controlled.

The speaker 1034 is provided for the housing 1031. The speaker 1034 has a function of outputting sound.

The electronic device illustrated in FIG. 8C functions as, for example, an automated teller machine, an information communication terminal for buying tickets or the like (also referred to as a multi-media station), or a game machine.

Figure 8D:
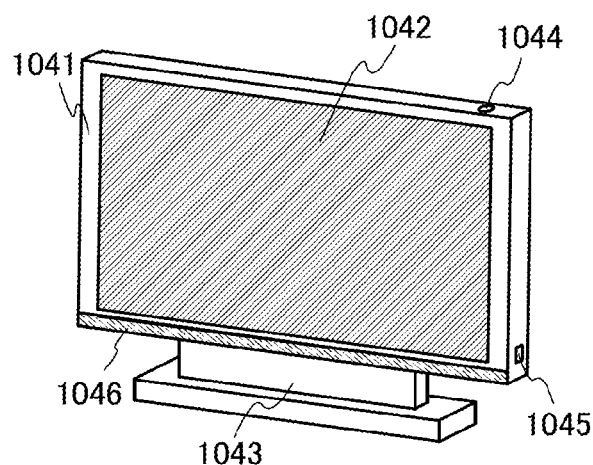

FIG. 8D illustrates an example of a stationary information terminal. The electronic device illustrated in FIG. 8D has a housing 1041, and a panel 1042, a button 1044, a connection terminal 1045, and a speaker 1046 that are provided for the housing 1041, and a support base 1043 supporting the housing 1041.

Note that a connection terminal for connecting the housing 1041 to an external device and/or a button used to operate the electronic device illustrated in FIG. 8D may be provided.

The panel 1042 functions as a display panel. The panel 1042 can be the display device in Embodiment 1. The panel 1042 may also function as a touch panel by superposing a touch panel on the display device described in Embodiment 1.

The button 1044 is provided for the housing 1041. For example, when the button 1044 which functions as a power button is provided and pushed, whether power is supplied to circuits in the electronic device can be controlled.

The connection terminal 1045 is provided for the housing 1041. The connection terminal 1045 is a terminal for connecting the electronic device illustrated in FIG. 8D to another device. For example, connecting the electronic device illustrated in FIG. 8D and a personal computer with the connection terminal 1045 enables the panel 1042 to display an image corresponding to a data signal input from the personal computer. For example, when the panel 1042 of the electronic device illustrated in FIG. 8D is larger than a panel of an electronic device connected thereto, a displayed image of the electronic device can be enlarged, in which case a plurality of viewers can recognize the image at the same time with ease.

The speaker 1046 is provided for the housing 1041. The speaker 1046 has a function of outputting sound.

The electronic device illustrated in FIG. 8D functions as, for example, an output monitor, a personal computer, or a television set.

As described with reference to FIGS. 8A to 8D, a panel of an electronic device can have high definition by employing the display device in Embodiment 1.

This application is based on Japanese Patent Application serial no. 2011-260573 filed with Japan Patent Office on Nov. 29, 2011, the entire contents of which are hereby incorporated by reference.

What is claimed is:
1. A display device comprising:
a pixel comprising a first transistor, a second transistor, a third transistor, an electroluminescent element, and a capacitor;
a data signal line;
a capacitor line; and
a semiconductor layer,
wherein a first terminal of the first transistor is electrically connected to a first terminal of the second transistor, wherein a second terminal of the second transistor is electrically connected to a first terminal of the electroluminescent element, wherein a gate of the first transistor is electrically connected to a first terminal of the capacitor, wherein a first terminal of the third transistor is electrically connected to the gate of the first transistor, wherein a second terminal of the third transistor is electrically connected to the data signal line, wherein the semiconductor layer includes the first terminal of the capacitor and a channel formation region of the third transistor, wherein the capacitor line includes a second terminal of the capacitor, wherein the second transistor is configured to operate in a saturation region to supply a current Id to the electroluminescent element when the first transistor operates in a linear region by controlling a voltage supplied to a gate of the second transistor, wherein the Id is defined by:

$$Id < \frac{1}{2}\frac{W}{L_1 + L_2}\mu Cox(V_g - V_{th})^2,$$

where $L_1$ is a channel length of the first transistor, $L_2$ is a channel length of the second transistor, W is each of channel widths of the first transistor and the second transistor, $\mu$ is each of field-effect mobilities of the first transistor and the second transistor, $V_g$ is a voltage supplied to a gate of the first transistor, $V_{th}$ is a threshold voltage of the first transistor, Cox is a sum of gate capacitances of the first transistor and the second transistor, wherein an amount of the current Id is controlled in accordance with a data signal supplied to the gate of the first transistor, and wherein the data signal line and the capacitor line overlap each other.

2. The display device according to claim 1, wherein a conductivity type of the first transistor is a same as a conductivity type of the second transistor.

3. The display device according to claim 1,
wherein the first transistor comprises a first semiconductor layer comprising a channel formation region,
wherein the second transistor comprises a second semiconductor layer comprising a channel formation region, and
wherein each of the first semiconductor layer and the second semiconductor layer is a single crystal silicon layer.

4. The display device according to claim 1 whose horizontal resolution is more than or equal to 800 ppi.

5. An electronic device comprising the display device according to claim 1.

6. A display device comprising:
a first pixel;
a second pixel;
a first data signal line;
a first gate signal line;
a second gate signal line;
a power supply line;
a capacitor line; and
a semiconductor layer,
wherein each of the first pixel and the second pixel comprises a first transistor, a second transistor, a third transistor, an electroluminescent element, and a capacitor,
wherein a first terminal of the first transistor of each of the first pixel and the second pixel is electrically connected to a first terminal of the second transistor of each of the first pixel and the second pixel, wherein a second terminal of the second transistor of each of the first pixel and the second pixel is electrically connected to a first terminal of the electroluminescent element of each of the first pixel and the second pixel, wherein a gate of the first transistor of each of the first pixel and the second pixel is electrically connected to a first terminal of the third transistor of each of the first pixel and the second pixel, wherein the gate of the first transistor of each of the first pixel and the second pixel is electrically connected to a first terminal of the capacitor of each of the first pixel and the second pixel, wherein a gate of the second transistor of each of the first pixel and the second pixel is electrically connected to the power supply line, wherein a second terminal of the third transistor of the first pixel is electrically connected to the first data signal line, wherein a second terminal of the third transistor of the second pixel is electrically connected to the first data signal line, wherein a gate of the third transistor of the first pixel is electrically connected to the first gate signal line, wherein a gate of the third transistor of the second pixel is electrically connected to the second gate signal line, wherein the semiconductor layer includes the first terminal of the capacitor of the first pixel and a channel formation region of the third transistor of the first pixel, wherein the capacitor line includes a second terminal of the capacitor of the first pixel, wherein the second transistor is configured to operate in a saturation region to supply a current Id to the electroluminescent element when the first transistor operates in a linear region by controlling a voltage supplied to the power supply line, wherein the Id is defined by:

$$Id < \frac{1}{2}\frac{W}{L_1 + L_2}\mu Cox(V_g - V_{th})^2,$$

where $L_1$ is a channel length of the first transistor, $L_2$ is a channel length of the second transistor, W is each of channel widths of the first transistor and the second transistor, $\mu$ is each of field-effect mobilities of the first transistor and the second transistor, $V_g$ is a voltage supplied to the gate of the first transistor, $V_{th}$ is a threshold voltage of the first transistor, Cox is a sum of gate capacitances of the first transistor and the second transistor, and wherein the first data signal line and the capacitor line overlap each other.

7. The display device according to claim 6, further comprising a third pixel and a second data signal line,
wherein a first terminal of a first transistor of the third pixel is electrically connected to a first terminal of a second transistor of the third pixel,
wherein a second terminal of the second transistor of the third pixel is electrically connected to a first terminal of an electroluminescent element of the third pixel,
wherein a gate of the first transistor of the third pixel is electrically connected to a first terminal of a third transistor of the third pixel,
wherein a gate of the second transistor of the third pixel is electrically connected to the power supply line, wherein a second terminal of the third transistor of the third pixel is electrically connected to the second data signal line, and wherein a gate of the third transistor of the third pixel is electrically connected to the first gate signal line.

8. The display device according to claim 6, wherein a conductivity type of the first transistor is a same as a conductivity type of the second transistor.

9. The display device according to claim 6, wherein the first transistor comprises a first semiconductor layer comprising a channel formation region, wherein the second transistor comprises a second semiconductor layer comprising a channel formation region, and wherein each of the first semiconductor layer and the second semiconductor layer is a single crystal silicon layer.

10. The display device according to claim 6 whose horizontal resolution is more than or equal to 800 ppi.

11. An electronic device comprising the display device according to claim 6.

12. A display device comprising:
a first pixel;
a second pixel;
a first power supply line;
a first capacitor line;
a second capacitor line;
a data signal line; and
a semiconductor layer, wherein each of the first pixel and the second pixel comprises a first transistor, a second transistor, a third transistor, an electroluminescent element, a capacitor, and a contact, wherein a first terminal of the first transistor of each of the first pixel and the second pixel is electrically connected to a first terminal of the second transistor of each of the first pixel and the second pixel, wherein a second terminal of the second transistor of each of the first pixel and the second pixel is electrically connected to a first terminal of the electroluminescent element of each of the first pixel and the second pixel, wherein a gate of the first transistor of each of the first pixel and the second pixel is electrically connected to a first terminal of the capacitor of each of the first pixel and the second pixel, wherein a second terminal of the first transistor of the first pixel is electrically connected to the first power supply line, wherein a second terminal of the first transistor of the second pixel is electrically connected to the first power supply line, wherein a first terminal of the third transistor of the first pixel is electrically connected to the gate of the first transistor of the first pixel, wherein a first terminal of the third transistor of the second pixel is electrically connected to the gate of the first transistor of the second pixel, wherein a second terminal of the third transistor of the first pixel is electrically connected to the data signal line, wherein the semiconductor layer includes the first terminal of the capacitor of the first pixel and a channel formation region of the third transistor of the first pixel, wherein the first capacitor line includes a second terminal of the capacitor of the first pixel, wherein the second capacitor line includes a second terminal of the capacitor of the second pixel, wherein the first power supply line is connected to the first capacitor line through the contact of the first pixel, wherein the first power supply line is connected to the second capacitor line through the contact of the second pixel, wherein the second transistor is configured to operate in a saturation region to supply a current Id to the electroluminescent element when the first transistor operates in a linear region by controlling a voltage supplied to a gate of the second transistor, wherein the Id is defined by:

$$Id < \frac{1}{2}\frac{W}{L_1+L_2}\mu Cox(V_g - V_{th})^2,$$

where $L_1$ is a channel length of the first transistor, $L_2$ is a channel length of the second transistor, W is each of channel widths of the first transistor and the second transistor, $\mu$ is each of field-effect mobilities of the first transistor and the second transistor, $V_g$ is a voltage supplied to the gate of the first transistor, $V_{th}$ is a threshold voltage of the first transistor, Cox is a sum of gate capacitances of the first transistor and the second transistor, and wherein the data signal line and the first capacitor line overlap each other.

13. The display device according to claim 12, further comprising a third pixel and a second power supply line, wherein a first terminal of a first transistor of the third pixel is electrically connected to a first terminal of a second transistor of the third pixel, wherein a second terminal of the second transistor of the third pixel is electrically connected to a first terminal of an electroluminescent element of the third pixel, wherein a gate of the first transistor of the third pixel is electrically connected to a first terminal of a capacitor of the third pixel, wherein a second terminal of the first transistor of the third pixel is electrically connected to the second power supply line, wherein a second terminal of the capacitor of the third pixel is electrically connected to the first capacitor line, and wherein the second power supply line is connected to the first capacitor line through the contact of the third pixel.

14. The display device according to claim 12, wherein a conductivity type of the first transistor is a same as a conductivity type of the second transistor.

15. The display device according to claim 12, wherein the first transistor comprises a first semiconductor layer comprising a channel formation region, wherein the second transistor comprises a second semiconductor layer comprising a channel formation region, and wherein each of the first semiconductor layer and the second semiconductor layer is a single crystal silicon layer.

16. The display device according to claim 12 whose horizontal resolution is more than or equal to 800 ppi.

17. An electronic device comprising the display device according to claim 12.

* * * * *